(12) United States Patent
Yamaguchi et al.

(10) Patent No.: US 11,764,305 B2
(45) Date of Patent: Sep. 19, 2023

(54) SEMICONDUCTOR DEVICE

(71) Applicant: Japan Display Inc., Tokyo (JP)

(72) Inventors: Yohei Yamaguchi, Tokyo (JP); Yuichiro Hanyu, Tokyo (JP); Hiroki Hidaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/510,534

(22) Filed: Oct. 26, 2021

(65) Prior Publication Data

US 2022/0045216 A1 Feb. 10, 2022

Related U.S. Application Data

(63) Continuation of application No. 16/735,800, filed on Jan. 7, 2020, now Pat. No. 11,189,734.

(30) Foreign Application Priority Data

Jan. 10, 2019 (JP) ................................ 2019-002939

(51) Int. Cl.
*H01L 27/00* (2006.01)
*H01L 29/00* (2006.01)
*H01L 29/786* (2006.01)
*H01L 29/423* (2006.01)
*H01L 21/02* (2006.01)
(Continued)

(52) U.S. Cl.
CPC .... *H01L 29/7869* (2013.01); *H01L 21/02266* (2013.01); *H01L 21/02554* (2013.01); *H01L 27/124* (2013.01); *H01L 27/1225* (2013.01); *H01L 27/1251* (2013.01);
(Continued)

(58) Field of Classification Search
CPC ......... H01L 21/02266; H01L 21/02554; H01L 21/0631; H01L 27/1225; H01L 27/124; H01L 27/1251; H01L 27/3272; H01L 29/7869; H01L 29/42384; H01L 29/78648;
(Continued)

(56) References Cited

U.S. PATENT DOCUMENTS 9,698,277 B2 * 7/2017 Yamazaki ........... C23C 14/3414
2016/0172500 A1 * 6/2016 Yamazaki ........... H01L 29/7869
257/43
2018/0286889 A1 10/2018 Yamaguchi

OTHER PUBLICATIONS

Japanese Office Action dated Jan. 17, 2023, issued in Japanese Patent Application No. 2019-002939, with English machine translation.
(Continued)

*Primary Examiner* — Nikolay K Yushin
(74) *Attorney, Agent, or Firm* — Michael Best & Friedrich LLP

(57) ABSTRACT

A semiconductor device including a first oxide semiconductor layer, a first gate electrode opposing the first oxide semiconductor layer, a first gate insulating layer between the first oxide semiconductor layer and the first gate electrode, a first insulating layer covering the first oxide semiconductor layer and having a first opening, a first conductive layer above the first insulating layer and in the first opening, the first conductive layer being electrically connected to the first oxide semiconductor layer, and an oxide layer between an upper surface of the first insulating layer and the first conductive layer, wherein the first insulating layer is exposed from the oxide layer in a region not overlapping the first conductive layer in a plan view.

9 Claims, 16 Drawing Sheets

(51) Int. Cl.
  *H01L 27/12* (2006.01)
  *H10K 59/126* (2023.01)
(52) U.S. Cl.
  CPC .. *H01L 29/42384* (2013.01); *H01L 29/78648* (2013.01); *H01L 29/78696* (2013.01); *H10K 59/126* (2023.02)
(58) Field of Classification Search
  CPC ............ H01L 29/78696; H10K 59/126; H10K 59/1213; H10K 59/40; H10K 59/38
  See application file for complete search history.

(56) References Cited

OTHER PUBLICATIONS

English translation of Chinese Office Action dated Mar. 6, 2023, issued in Chinese Application No. 202010008900.6.

\* cited by examiner

SEMICONDUCTOR DEVICE

CROSS REFERENCE TO RELATED APPLICATIONS

This application is a continuation of U.S. patent application Ser. No. 16/735,800, filed on Jan. 7, 2020. Further, this application is based upon and claims the benefit of priority from the prior Japanese Patent Application No. 2019-002939, filed on Jan. 10, 2019, the entire contents of which are incorporated herein by reference.

FIELD

One embodiment of the present invention is related to a semiconductor device and a display device. In particular, one embodiment of the present invention is related a semiconductor device in which oxide semiconductor is used as a channel and a display device arranged with the semiconductor device.

BACKGROUND

In recently years, the development of a semiconductor device using an oxide semiconductor for a channel has been progressing (for example, Japanese Laid Open Patent Publication No. 2016-197708) in place of amorphous silicon, low-temperature polysilicon and single crystal silicon. A semiconductor device which uses an oxide semiconductor for a channel can be formed with a simple structure and at a low-temperature process similar to a semiconductor device which uses amorphous silicon for a channel. It is known that a semiconductor device which uses an oxide semiconductor for a channel has higher mobility than a semiconductor which device uses amorphous silicon for a channel. A semiconductor device which uses an oxide semiconductor for a channel is known to have a very low off current.

In order to stably operate for a semiconductor device which uses an oxide semiconductor, it is important to supply a large amount of oxygen to the oxide semiconductor in the manufacturing process and reduce oxygen vacancies which are formed in the oxide semiconductor. Japanese Laid Open Patent Application No. 2016-197708 discloses a technique for forming an insulating layer which covers an oxide semiconductor under a condition where the insulating layer includes a large amount of oxygen as one method for supplying oxygen to an oxide semiconductor.

However, an insulating layer which is formed under the condition where a large amount of oxygen is includes also contains many defects. Characteristic variations in reliability test or characteristic abnormalities of a semiconductor device occur which are considered to be caused by electrons being trapped in the defect. On the other hand, when an insulating layer with few defects is used, since oxygen included in the insulating layer cannot be increased, oxygen cannot be sufficiently supplied from the insulating layer to the oxide semiconductor. When a metal film is formed as a conductive layer above the insulating layer, oxygen in the insulating layer is reduced by the metal film which is formed, and the insulating layer is in an oxygen deficient state. There is concern that the oxygen-deficient insulating layer might extract oxygen from the oxide semiconductor during a heat treatment step.

SUMMARY

A semiconductor device in an embodiment according to the present invention includes a first oxide semiconductor layer, a first gate electrode opposing the first oxide semiconductor layer, a first gate insulating layer between the first oxide semiconductor layer and the first gate electrode, a first insulating layer covering the first oxide semiconductor layer and having a first opening, a first conductive layer above the first insulating layer and in the first opening, the first conductive layer being electrically connected to the first oxide semiconductor layer, and an oxide layer between an upper surface of the first insulating layer and the first conductive layer, wherein the first insulating layer is exposed from the oxide layer in a region not overlapping the first conductive layer in a plan view.

A semiconductor device in an embodiment according to the present invention includes a first oxide semiconductor layer, a first gate electrode opposing the first oxide semiconductor layer, a first gate insulating layer between the first oxide semiconductor layer and the first gate electrode, a first insulating layer covering the first oxide semiconductor layer and having a first opening, a first conductive layer above the first insulating layer and in the first opening, the first conductive layer being electrically connected to the first oxide semiconductor layer, and an oxide layer being a semiconductor or a conductor between an upper surface of the first insulating layer and the first conductive layer.

A display device in an embodiment according to the present invention includes a semiconductor device described above, a second insulating layer above the semiconductor device, the second insulating layer having a third opening, the third opening reaching the first conductive layer, and a pixel electrode above the second insulating layer and in the third opening, the pixel electrode contacting the first conductive layer.

DESCRIPTION OF EMBODIMENTS

Figure 1:
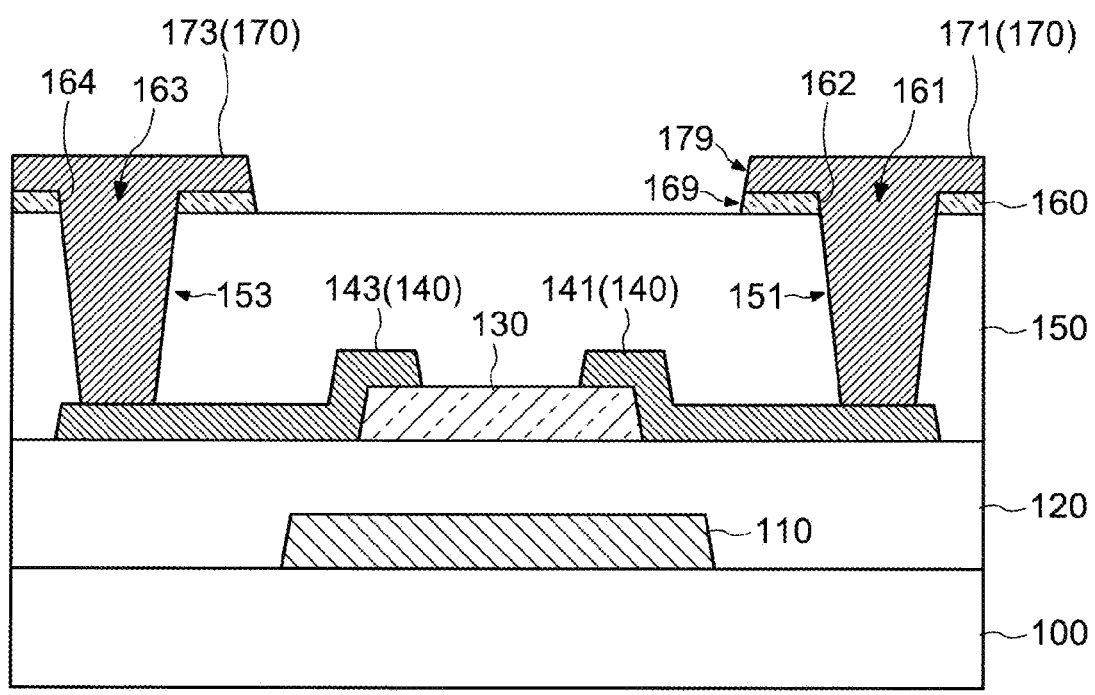
FIG. 1 is a cross-sectional diagram showing a summary of a semiconductor device related to one embodiment of the present invention.

Each embodiment of the present invention is explained below while referring to the drawings. However, the disclosure herein is only an example and a structure easily arrived at by a person skilled in the art by making appropriate modifications without departing from the concept of the invention is naturally to be contained in the scope of the present invention. The drawings may be schematically represented with the width, thickness, shape and the like of each part as compared with the actual form in order to clarify the explanation more clearly. However, they are only an example and do not limit an interpretation of the present invention. In the specification and drawings, elements having the same functions as those described with reference to preceding figures are attached with a letter of the alphabet after the same reference symbol and a detailed explanation may be omitted as appropriate.

In each embodiment of the present invention, a direction from a substrate towards an oxide semiconductor layer is referred to as "up" or "above". Conversely, a direction from the semiconductor layer towards the substrate is referred to as "down" or "below". As described above, for the convenience of explanation, although an explanation is made using the terms "upper" or "lower", for example, the vertical relationship between the substrate and the semiconductor layer may be reversed. In the explanation below, for example, the expression "semiconductor layer on the substrate" merely describes the vertical relationship between the substrate and the semiconductor layer as described above, other members may also be arranged between the substrate and the semiconductor layer. Upper or lower means the stacking order in a structure in which a plurality of layers is stacked, and in the case when a pixel electrode is expressed as above a transistor, it may be a positional relationship in which the transistor and the pixel electrode do not overlap in a plan view. On the other hand, when a pixel electrode is expressed vertically above a transistor, it means a positional relationship in which the transistor and the pixel electrode overlap in a plan view.

"Display device" refers to a structure that displays an image using an electro-optic layer. For example, the term "display device" may refer to a display panel including an electro-optical layer, or a structure in which another optical member (for example, a polarizing member, a backlight, a touch panel, or the like) is attached to a display cell. The "electro-optic layer" may include a liquid crystal layer, an electroluminescence (EL) layer, an electrochromic (EC) layer, and an electrophoretic layer as long as no technical contradiction occurs. Therefore, the embodiments described later will be described by exemplifying a liquid crystal display device including a liquid crystal layer and an organic EL display device including an organic EL layer as a display device. The present invention can be applied to a display device including the electro-optic layer mentioned above.

In the present specification, the expressions "α includes A, B or C", "α includes any of A, B and C", and "α includes one selected from the group consisting of A, B and C" unless otherwise stated does not exclude the case where α includes a plurality of combinations of A to C. Furthermore, these expressions do not exclude the case where α includes other elements.

Furthermore, each of the following embodiments can be combined with each other as long as no technical contradiction occurs.

One aspect of an embodiment of the present invention is to realize a semiconductor device which can sufficiently supply oxygen to an oxide semiconductor which is used as channel of a semiconductor device, and which can further suppress oxygen being desorbed from the oxide semiconductor.

First Embodiment

A semiconductor device and a manufacturing method of the semiconductor device related to one embodiment of the present invention is explained using FIG. 1 to FIG. 7. The semiconductor device of the embodiments shown herein may also use an integrated circuit (IC) such as a microprocessing unit (MPU) or a memory circuit in addition to a semiconductor device such as a transistor used in a display device.

[Structure of Semiconductor Device 10]

Figure 2:
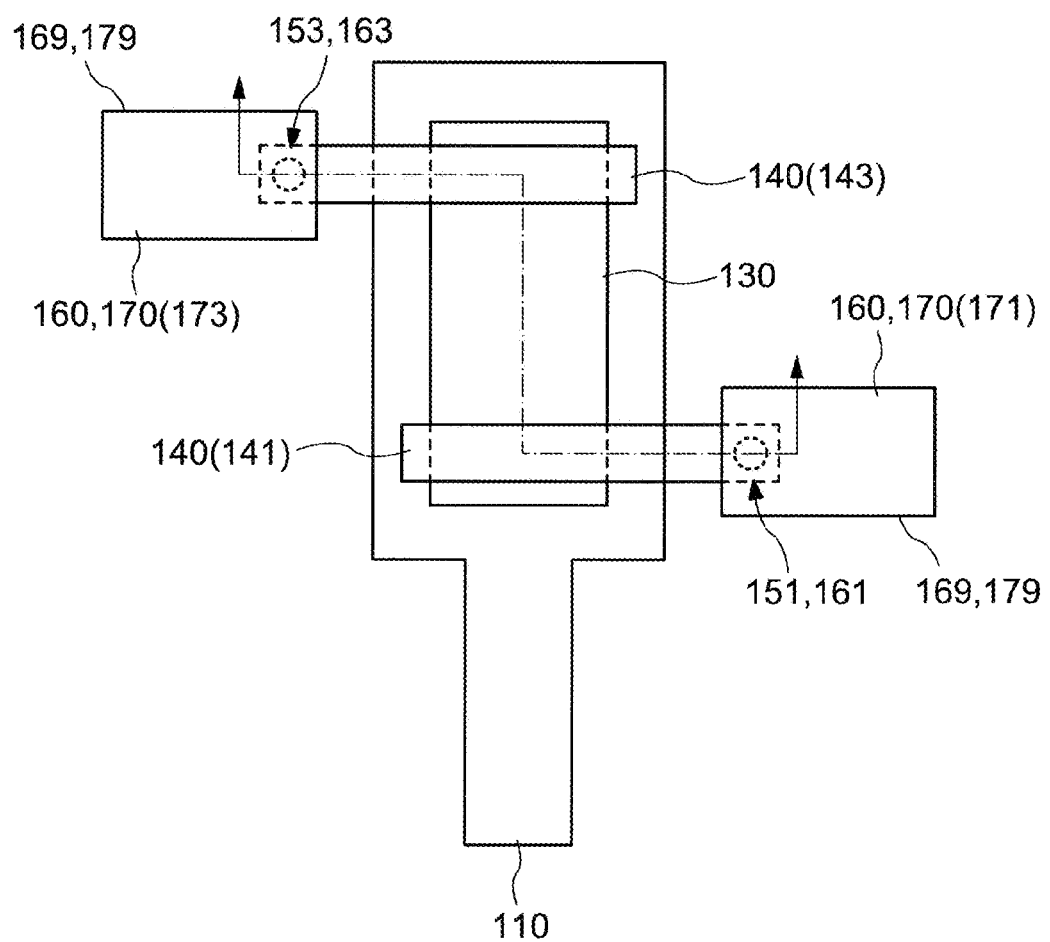
FIG. 2 is a plan view diagram showing a summary of a semiconductor device related to one embodiment of the present invention.

The structure of a semiconductor device 10 related to one embodiment of the present invention is explained using FIG. 1 and FIG. 2. FIG. 1 is a cross-sectional diagram showing a summary of a semiconductor device related to one embodiment of the present invention. FIG. 2 is a plan diagram showing a summary of a semiconductor device related to one embodiment of the present invention.

As is shown in FIG. 1, the semiconductor device 10 is arranged above the substrate 100. The semiconductor device 10 includes a first gate electrode 110, a first gate insulating layer 120, a first oxide semiconductor layer 130, a first source electrode 141, a first drain electrode 143, a first insulating layer 150, an oxide layer 160, a first source wiring 171 and a first drain wiring 173. In the case when the first source electrode 141 and the first drain electrode 143 are not particularly distinguished, these electrodes may be referred to as the first electrode 140. In the case when the first source wiring 171 and the first drain wiring 173 are not particularly distinguished, these wirings may be referred to as the first conductive layer 170.

The first gate electrode 110 is arranged above the substrate 100. The first gate electrode 110 faces the first oxide semiconductor layer 130. The first gate insulating layer 120 is arranged the first gate electrode 110 and the first oxide semiconductor layer 130. The first electrode 140 is arranged above the first gate insulating layer 120 and above the first oxide semiconductor layer 130. The first electrode 140 extends from the upper surface of the first gate insulating layer 120 to the pattern end part of the first oxide semiconductor layer 130 and continues to the upper surface of the first oxide semiconductor layer 130. That is, the first electrode 140 is in contact with a sidewall and the upper surface of the first oxide semiconductor layer 130. In the present embodiment, although the bottom gate type semiconductor device 10 in which the first gate electrode 110 is arranged below the first oxide semiconductor layer 130 is shown, the semiconductor device may also be a top gate type semiconductor device in which the gate electrode is arranged above the oxide semiconductor layer.

The first insulating layer 150 covers the first oxide semiconductor layer 130 and the first electrode 140. First openings 151 and 153 are arranged in the first insulating layer 150. The first opening 151 is an opening which reaches the first source electrode 141. The first opening 153 is an opening which reaches the first drain electrode 143. The oxide layer 160 is arranged above the first insulating layer 150. Second openings 161 and 163 are arranged in the oxide layer 160. The second opening 161 is an opening which is continuous with the first opening 151. The second opening 163 is an opening which is continuous with the first opening 153.

In the present embodiment, an inner wall of the first opening 151 and an inner wall of the second opening 161 are continuous, and an inner wall of the first opening 153 and an inner wall of the second opening 163 are continuous. In other words, in a cross-sectional view, a side wall of the second opening 161 and a side wall of the first opening 151 have a continuous linear shape, and a side wall of the second opening 163 and a side wall of the first opening 153 have a continuous linear shape. The oxide layer 160 is not arranged in the first openings 151 and 153.

The first conductive layer 170 is arranged above the oxide layer 160 and inside the first openings 151 and 153. In other words, the oxide layer 160 is arranged between the upper surface of the first insulating layer 150 and the lower surface of the first conductive layer 170. In other words, the first conductive layer 170 which is arranged vertically above the first insulating layer 150 is separated from the upper surface of the first insulating layer 150 by the oxide layer 160. The oxide layer 160 is not arranged and the first insulating layer 150 is exposed from the oxide layer 160 in a region which does not overlap the first conductive layer 170 in a plan view. The first conductive layer 170 is in contact with the sidewalls 162 and 164 of the oxide layer 160 at the second openings 161 and 163. The first conductive layer 170 is in contact with the first electrode 140 at the bottom part of the first openings 151 and 153, and is electrically connected to the first oxide semiconductor layer 130 via the first electrode 140.

Although a structure is exemplified in FIG. 1 in which the side walls of the first openings 151 and 153 and the side walls of the second openings 161 and 163 are continuous in a cross-sectional view, the structure is not limited thereto. For example, the inclination angle of the first openings 151 and 153 may be different from the inclination angle of the second openings 161 and 163 due to a difference in the etching rates between the oxide layer 160 and the first insulating layer 150. Alternatively, the opening size of the second openings 161 and 163 may be larger than the opening size of the first openings 151 and 153, and a step may be formed between the side walls of the first openings 151 and 153 and the side walls of the second openings 161 and 163.

Similar to the above, although FIG. 1 exemplifies a structure in which the side wall at the outer edge 169 of the oxide layer 160 and the side wall at the outer edge 179 of the first conductive layer 170 have a linear shape in a cross-sectional view, the present invention is not limited to this structure. The inclination angle of the oxide layer 160 at the outer edge 169 may be different from the inclination angle of the first conductive layer 170 at the outer edge 179. Alternatively, a step may also be formed between the oxide layer 160 and the first conductive layer 170.

Although FIG. 1 exemplifies a case where each layer is formed by one layer, each layer may also have a stacked layer structure.

As is shown in FIG. 2, the first oxide semiconductor layer 130 is arranged on the inner side of the first gate electrode 110 in a plan view. In particular, the first oxide semiconductor layer 130 is arranged on the inner side of the first gate electrode 110 in a region where the channel of the semiconductor device 10 is formed. In other words, the outer edge of the pattern of the first oxide semiconductor layer 130 is surrounded by the outer edge of the pattern of the first gate electrode 110. The first electrode 140 crosses the first oxide semiconductor layer 130 in a plan view. In other words, the first electrode 140 intersects the first oxide semiconductor layer 130. The second opening 161 overlaps the first opening 151 in a plan view. The second opening 163 overlaps the first opening 153 in a plan view. In the present embodiment, the first opening 151 and the second opening 161 are arranged at the same position in a plan view, and the first opening 153 and the second opening 163 are arranged at the same position. The structure described above is merely one embodiment, and the present invention is not limited to the structure described above.

In a plan view, the pattern of the oxide layer 160 is substantially the same as the pattern of the first conductive layer 170 except for the second openings 161 and 163. That is, in a plan view, the outer edge 169 of the oxide layer 160 and the outer edge 179 of the first conductive layer 170 exist at substantially the same position. As is shown in FIG. 1 and FIG. 2, the end part of the oxide layer 160 and the end part of the first conductive layer 170 are in alignment.

Substantially the same means that the outer edge 169 and the outer edge 179 exist at almost the same position as described above. However, the present embodiment is not limited to a structure in which both outer edges completely match each other in a plan view. For example, both patterns which are obtained by processing the first conductive layer 170 and the oxide layer 160 using the same mask are referred to as substantially the same pattern. There is a possibility that the oxide layer 160 and the first conductive layer 170 may have slightly different patterns depending on the difference in their etching rates or the like. For example, in the case when the end parts of each pattern of the oxide layer 160 and the first conductive layer 170 are tapered, or in the case when a step is formed between the oxide layer 160 and the first conductive layer 170 and a part of the upper surface of the layer 160 is exposed from the first conductive layer 170, the outer edge 169 of the oxide layer 160 is located slightly to the outer side of the outer edge 179 of the first conductive layer 170. That is, the pattern of the oxide layer 160 is located slightly to the outer side of the pattern of the first conductive layer 170. In this way, even when each of the patterns are not completely the same due to processing of the oxide layer 160 and the first conductive layer 170, the pattern of the oxide layer 160 is a pattern which is substantially the same as the pattern of the first conductive layer 170.

In the present embodiment, although a structure is exemplified in which the oxide layer 160 is patterned substantially the same as the first conductive layer 170, the present invention is not limited to this structure. For example, in the case when the oxide layer 160 is an insulating layer, the oxide layer 160 may not be patterned. On the other hand, in the case when the oxide layer 160 is a semiconductor layer or a conductive layer, the oxide layer 160 is patterned in order to insulate the first source wiring 171 and the first drain wiring 173. That is, the first insulating layer 150 is exposed from the oxide layer 160 in a region where the oxide layer 160 does not overlap with the first conductive layer 170 in a plan view.

Although FIG. 2 exemplified a structure in which the first openings 151 and 153 and the second openings 161 and 163 are arranged in the same pattern in a plan view, the present embodiment is not limited to this structure. It is sufficient that the first openings 151 and 153 overlap with the second openings 161 and 163 in a plan view, and they do not have to be completely the same pattern. Similarly, although a structure is exemplified in FIG. 2 in which the oxide layer 160 and the first conductive layer 170 in a plan view are arranged provided in substantially the same pattern except for the second openings 161 and 163, the present embodiment is not limited to this structure.

[Material of Each Member]

A substrate including a resin such as a polyimide substrate, an acrylic substrate, a siloxane substrate or a fluororesin substrate can be used as the substrate 100. That is, it is possible to use a flexible substrate having flexibility as the substrate 100. Impurities may also be introduced into the resin described above in order to improve heat resistance of the substrate 100. In particular, in the case when the semiconductor device 10 is a top emission type display, it is not necessary that the substrate 100 be transparent. Therefore, it is possible to use impurities which do not deteriorate the transparency of the substrate 100. On the other hand, in the case when the substrate 100 does not need flexibility, a rigid substrate which has translucency but does not have flexibility such as a glass substrate, a quartz substrate and a sapphire substrate can be used as the substrate 100. In the case where the semiconductor device 10 is used for an integrated circuit which is not a display device, it is possible to use a silicon substrate, a silicon carbide substrate, or a compound semiconductor substrate, or a substrate which does not have translucency such as a conductive substrate such as a stainless steel substrate as the substrate 100.

It is possible to use a general metal material as the first gate electrode 110, the first electrode 140, and the first conductive layer 170. For example, it is possible to use aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag) or an alloy or compound of these materials as these members.

It is possible to use a general insulating layer material as the first gate insulating layer 120 and the first insulating layer 150. For example, it is possible to use an inorganic insulating layer such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$) or aluminum nitride ($AlN_x$) as these insulating layers. It is preferred to use insulating layers with few defects as these insulating layers. For example, the composition ratio of oxygen in the first insulating layer 150 is higher than the composition ratio of oxygen in the other insulating layers having the same composition as the first insulating layer 150, and is close to the composition ratio of oxygen in the stoichiometric amount of an insulating layer having the same compound as the first insulating layer 150. In addition to the inorganic insulating material described above, an organic insulating material can also be used as the insulating layer. Polyimide resin, acrylic resin, epoxy resin, silicone resin, fluorine resin and siloxane resin or the like can be used as the organic insulating material. An inorganic insulating layer material and an organic insulating material may be used independently or may be stacked as the first insulating layer 150.

$SiO_xN_y$ and $AlO_xN_y$ described above are a silicon compound and an aluminum compound containing nitrogen (N) at a smaller amount than oxygen (O). In addition, $SiN_xO_y$ and $AlN_xO_y$ are a silicon compound and an aluminum compound containing oxygen at a smaller amount than nitrogen.

It is possible to use a metal oxide having semiconductor characteristics as the first oxide semiconductor layer 130. For example, it is possible to use an oxide semiconductor containing indium (In), gallium (Ga), zinc (Zn), and oxygen (O) as the first oxide semiconductor layer 130. In particular, it is possible to use an oxide semiconductor having a composition ratio of In:Ga:Zn:O=1:1:1:4 as the first oxide semiconductor layer 130. However, the oxide semiconductor which is used in this embodiment and includes In, Ga, Zn, and O is not limited to the composition described above. It is possible to use an oxide semiconductor having a composition different from that described above as the oxide semiconductor. For example, the In ratio may be increased more than the ratio described above in order to improve mobility. In addition, in order to increase the band gap and reduce the influence of light irradiation, the Ga ratio may also be increased more than the ratio described above.

Other elements may also be added to the oxide semiconductor containing In, Ga, Zn, and O. For example, a metal element such as Al or Sn may be added to the oxide semiconductor. In addition to the oxide semiconductors described above, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), an oxide semiconductor containing In and Ga (IGO), an oxide semiconductor containing In and Zn (IZO), an oxide semiconductor containing In, Sn and Zn (ITZO), and an oxide semiconductor containing In and W and the like can be used for the first oxide semiconductor layer 130. The first oxide semiconductor layer 130 may be amorphous or crystalline. The first oxide semiconductor layer 130 may also be a mixed phase of amorphous and crystalline.

It is possible to use an oxide semiconductor layer having the same composition as the first oxide semiconductor layer 130, an oxide conductive layer such as ITO, or an oxide insulating layer such as $SiO_x$, $SiO_xN_y$, $AlO_x$, and $AlO_xN_y$ as the oxide layer 160. The oxide layer 160 is preferred to be formed by a sputtering method. In the case where the oxide layer 160 is formed by a sputtering method, a process gas which is used in the sputtering may sometimes remain in the oxide layer 160 film. For example, in the case when argon (Ar) is used as the sputtering process gas, Ar remains within the oxide layer 160 film. The remaining Ar can be detected in the oxide layer 160 by SIMS (Secondary Ion Mass Spectrometry) analysis. In the case where an oxide insulating layer having the same composition as the material which is used for the first insulating layer 150 is used as the oxide layer 160, the composition ratio of oxygen in the oxide layer 160 is larger than the composition ratio of oxygen in the first insulating layer 150.

As described above, according to the semiconductor device 10 related to the present embodiment, the oxide layer 160 suppresses contact between the upper surface of the first insulating layer 150 and the first conductive layer 170. Therefore, it is possible to suppress the oxygen within the first insulating layer 150 from being reduced by the first conductive layer 170. That is, the first insulating layer 150 is suppressed from being in an oxygen deficient state. As a result, oxygen within the first oxide semiconductor layer 130 can be prevented from diffusing into the first insulating layer 150. Since oxygen is supplied to the first insulating layer 150 by the oxide layer 160, it is possible to arrange the first insulating layer 150 having a quality suitable for the first oxide semiconductor layer 130 without limiting the film quality of the first insulating layer 150.

[Manufacturing Method of Semiconductor Device 10]

A manufacturing method of the semiconductor device 10 according to one embodiment of the present invention is explained using FIG. 3 to FIG. 7. FIG. 3 to FIG. 7 are cross-sectional diagrams showing a manufacturing method of a semiconductor device according to one embodiment of the present invention.

Figure 3:
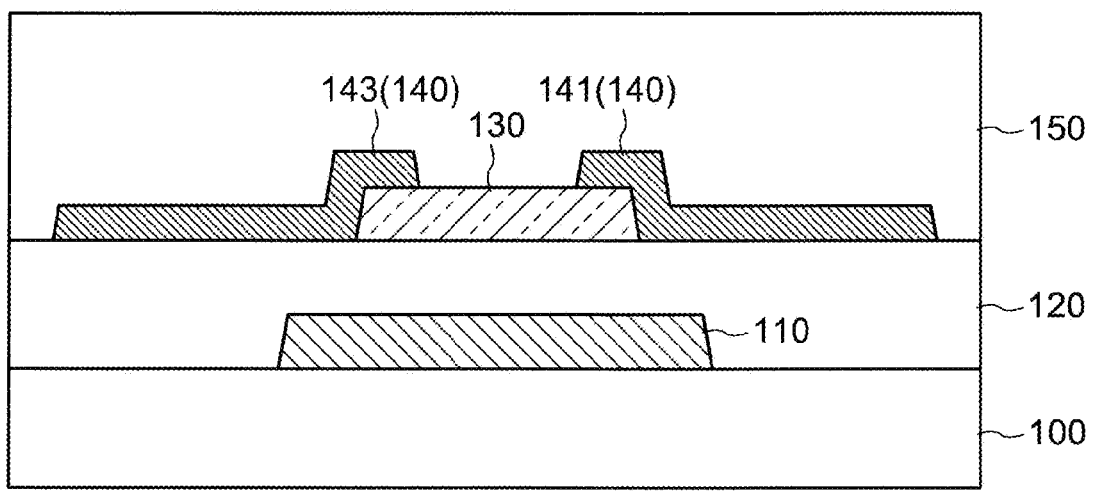
FIG. 3 is a cross-sectional diagram showing a manufacturing method of a semiconductor device related to one embodiment of the present invention.

As is shown in FIG. 3, a structure from the first gate electrode 110 to the first insulating layer 150 is formed by a general manufacturing method of a bottom gate type semiconductor device. The formation of the first insulating layer 150 is performed under the condition that the number of defects included in the first insulating layer 150 is smaller. That is, the first insulating layer 150 immediately after film formation is not an insulating layer which releases oxygen, or an insulating layer which releases an insufficient amount of oxygen.

Figure 4:
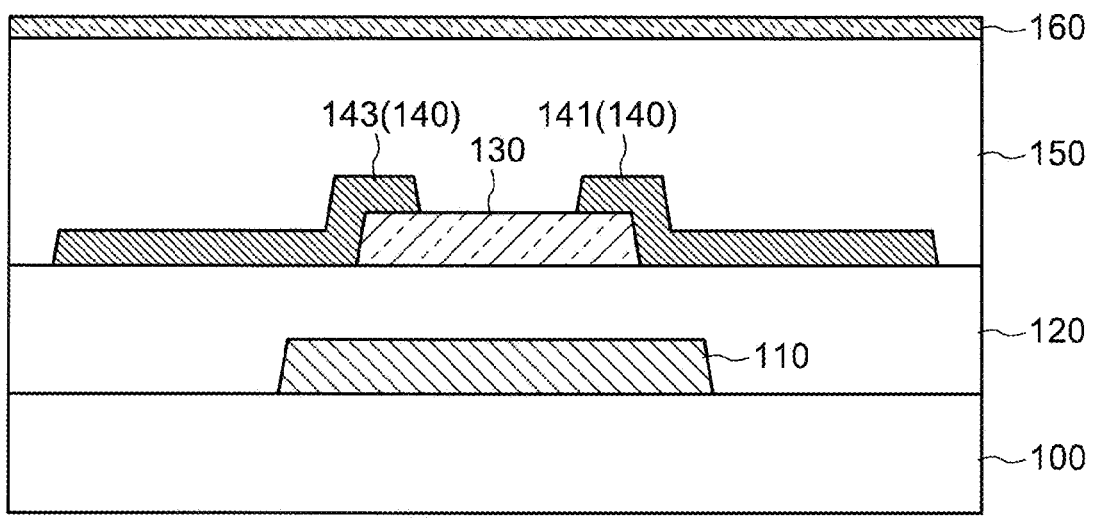
FIG. 4 is a cross-sectional diagram showing a manufacturing method of a semiconductor device related to one embodiment of the present invention.

As is shown in FIG. 4, an oxide layer 160 is formed above the first insulating layer 150. The oxide layer 160 is formed by a sputtering method. When the oxide layer 160 is formed by a sputtering method, the oxygen gas used as a process gas within the sputtering is ionized with the plasma to generate oxygen negative ions. The oxygen negative ions are accelerated toward the substrate 100 as a film formation target by a sheath potential, and are implanted into the first insulating layer 150 which is formed on the upper part of the substrate 100. That is, oxygen is introduced in the process of forming the oxide layer 160 with respect to the first insulating layer 150 which does not discharge oxygen immediately after film formation, or in which the discharged oxygen was insufficient. Through this process, the first insulating layer 150 is changed to an insulating layer including excess oxygen and releasing oxygen by a heat treatment. In this process, although oxygen is introduced into the upper part region of the first insulating layer 150 (near the interface between the oxide layer 160 and the first insulating layer 150), the first insulating layer 150 of a lower part region (near the interface between the first oxide semiconductor layer 130 and the first insulating layer 150) still remains an insulating layer with few defects.

After forming the oxide layer 160 a heat treatment is performed. Oxygen implanted into the first insulating layer 150 diffuses in the first insulating layer 150 by this heat treatment. A part of the diffused oxygen reaches the first oxide semiconductor layer 130. Oxygen vacancies which are formed in the first oxide semiconductor layer 130 are repaired by oxygen reaching the first oxide semiconductor layer 130. That is, oxygen vacancies in the first oxide semiconductor layer 130 are reduced by the heat treatment.

Figure 5:
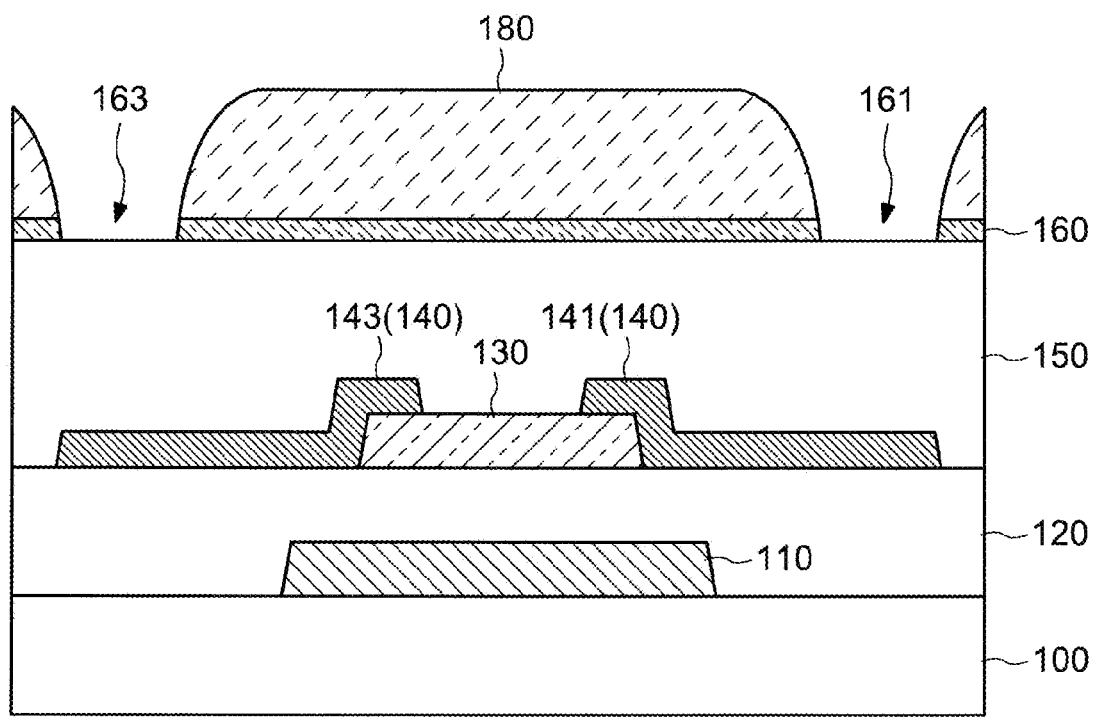
FIG. 5 is a cross-sectional diagram showing a manufacturing method of a semiconductor device related to one embodiment of the present invention.

As is shown in FIG. 5, a photoresist 180 is formed on the oxide layer 160. The oxide layer 160 is etched using the photoresist 180 as a mask, and the second openings 161 and 163 are formed in the oxide layer 160. Wet etching is used as the etching of the oxide layer 160. However, the etching may also be performed by dry etching.

Figure 6:
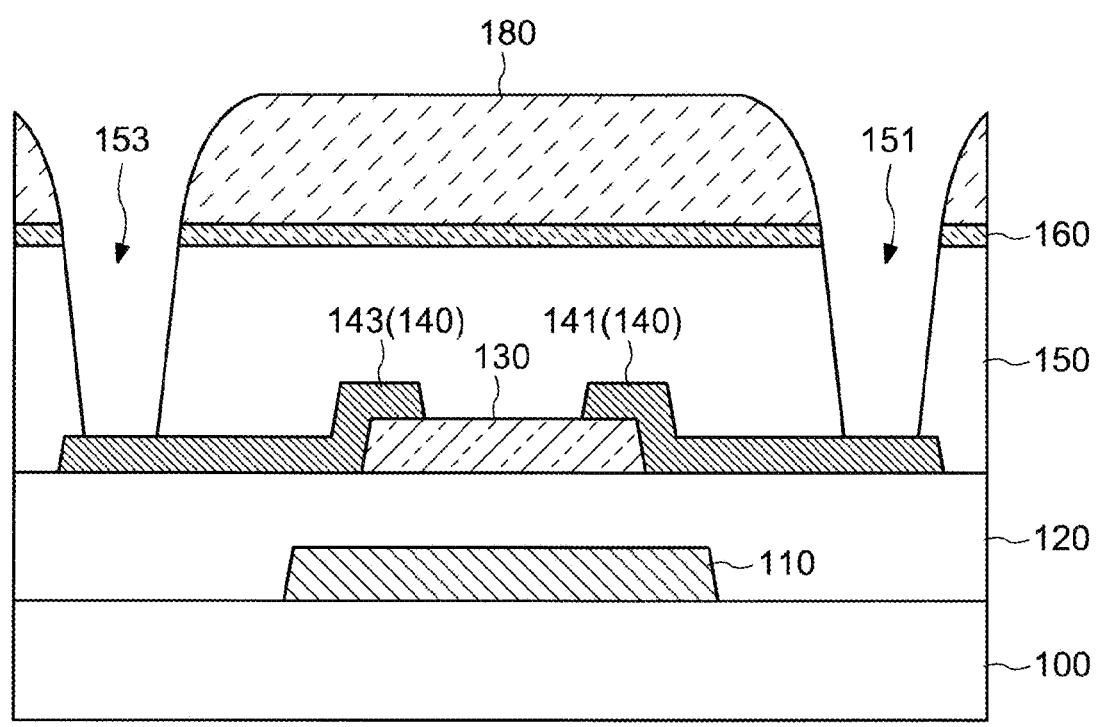
FIG. 6 is a cross-sectional diagram showing a manufacturing method of a semiconductor device related to one embodiment of the present invention.

As is shown in FIG. 6, the first insulating layer 150 is etched using the photoresist 180 as a mask and the first openings 151 and 153 are formed in the first insulating layer 150. Dry etching is used as the etching of the first insulating layer 150. However, the etching may also be performed by wet etching.

Figure 7:
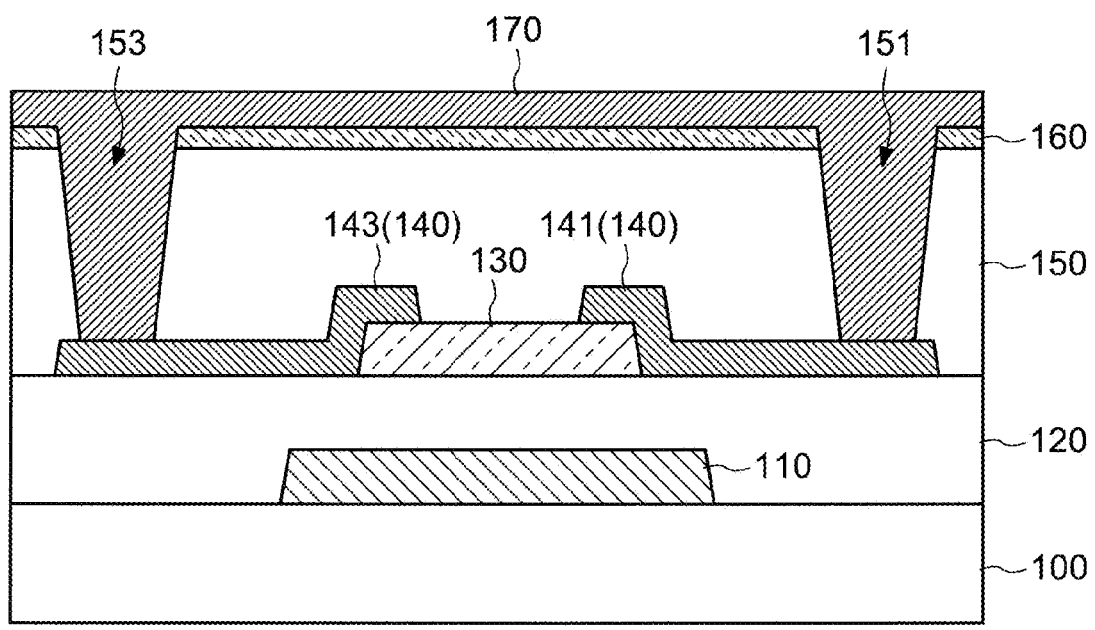
FIG. 7 is a cross-sectional diagram showing a manufacturing method of a semiconductor device related to one embodiment of the present invention.

Although a method is exemplified in FIG. 6 in which the first insulating layer 150 is etched using the photoresist 180 as a mask, the present embodiment is not limited to this method. For example, in the case when an etching condition in which the etching rate of the first insulating layer 150 is a sufficiently larger (faster) condition than the etching rate of the oxide layer 160 is used to etch the first insulating layer 150, the oxide layer 160 as shown in FIG. 5, the photoresist 180 may be removed in a state where the second openings 161 and 163 are formed in the oxide 160, and the first insulating layer 150 may be etched using the oxide layer 160 as a mask. Alternatively, both the oxide layer 160 and the first insulating layer 150 may be etched by the same etching process As shown in FIG. 7, the photoresist 180 is removed and a first conductive layer 170 is formed. The first conductive layer 170 is formed on the oxide layer 160 and on the inside of the first openings 151 and 153. The first conductive layer 170 is in contact with the first insulating layer 150 at the side walls of the first openings 151 and 153. On the other hand, since the oxide layer 160 is formed on the upper surface of the first insulating layer 150, the first conductive layer 170 does not contact the upper surface of the first insulating layer 150. In addition, it is possible to form the semiconductor device 10 shown in FIG. 1 by etching the first conductive layer 170 and the oxide layer 160. The first conductive layer 170 and the oxide layer 160 may be etched by the same process, or may be etched by separate processes.

In the process shown in FIG. 7, when the first conductive layer 170 is formed to contact with the upper surface of the first insulating layer 150, the oxygen in the first insulating layer 150 may be reduced due to the energy at the time of forming the first conductive layer 170 and the difference in enthalpy of formation of both oxides. When oxygen in the first insulating layer 150 is reduced, the first insulating layer 150 becomes an oxygen deficient state. Therefore, the first insulating layer 150 may extract oxygen from the first oxide semiconductor layer 130 by performing a heat treatment in a subsequent process. However, as in the present embodiment, it is possible to suppress a reduction of oxygen in the first insulating layer 150 described above by separating the upper surface of the first insulating layer 150 from the first conductive layer 170 by the oxide layer 160 as in the present embodiment.

Second Embodiment

Figure 8:
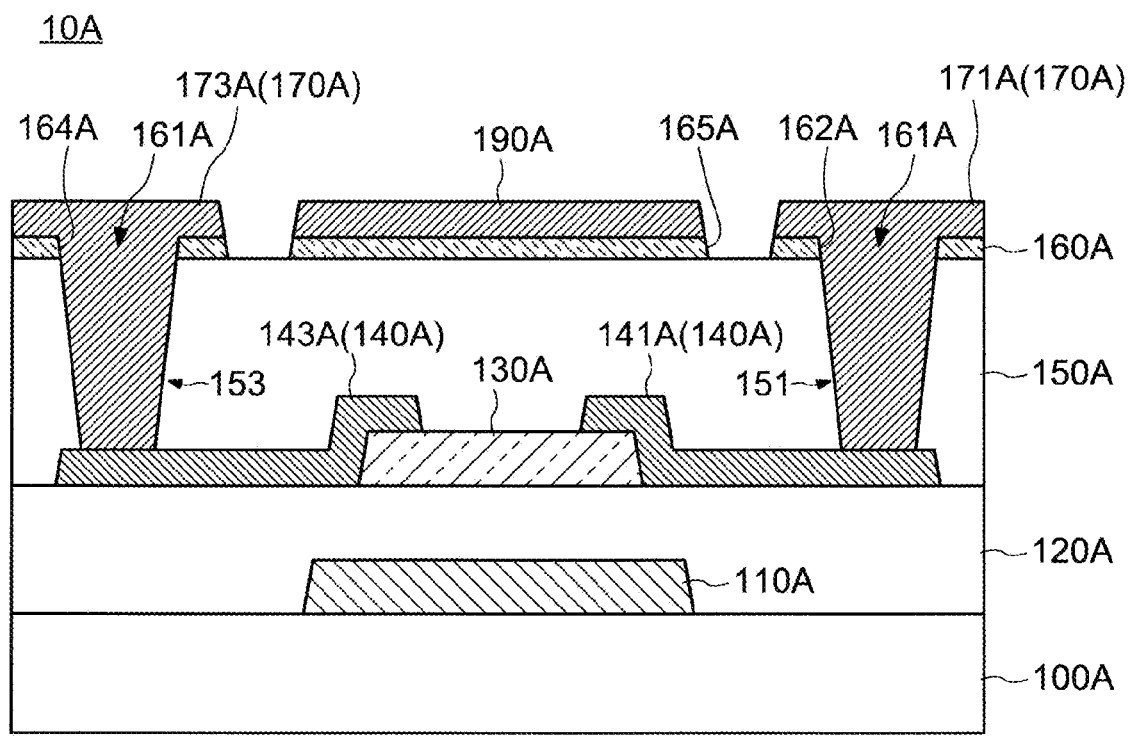
FIG. 8 is a cross-sectional diagram showing a summary of a semiconductor device related to one embodiment of the present invention.
Figure 9:
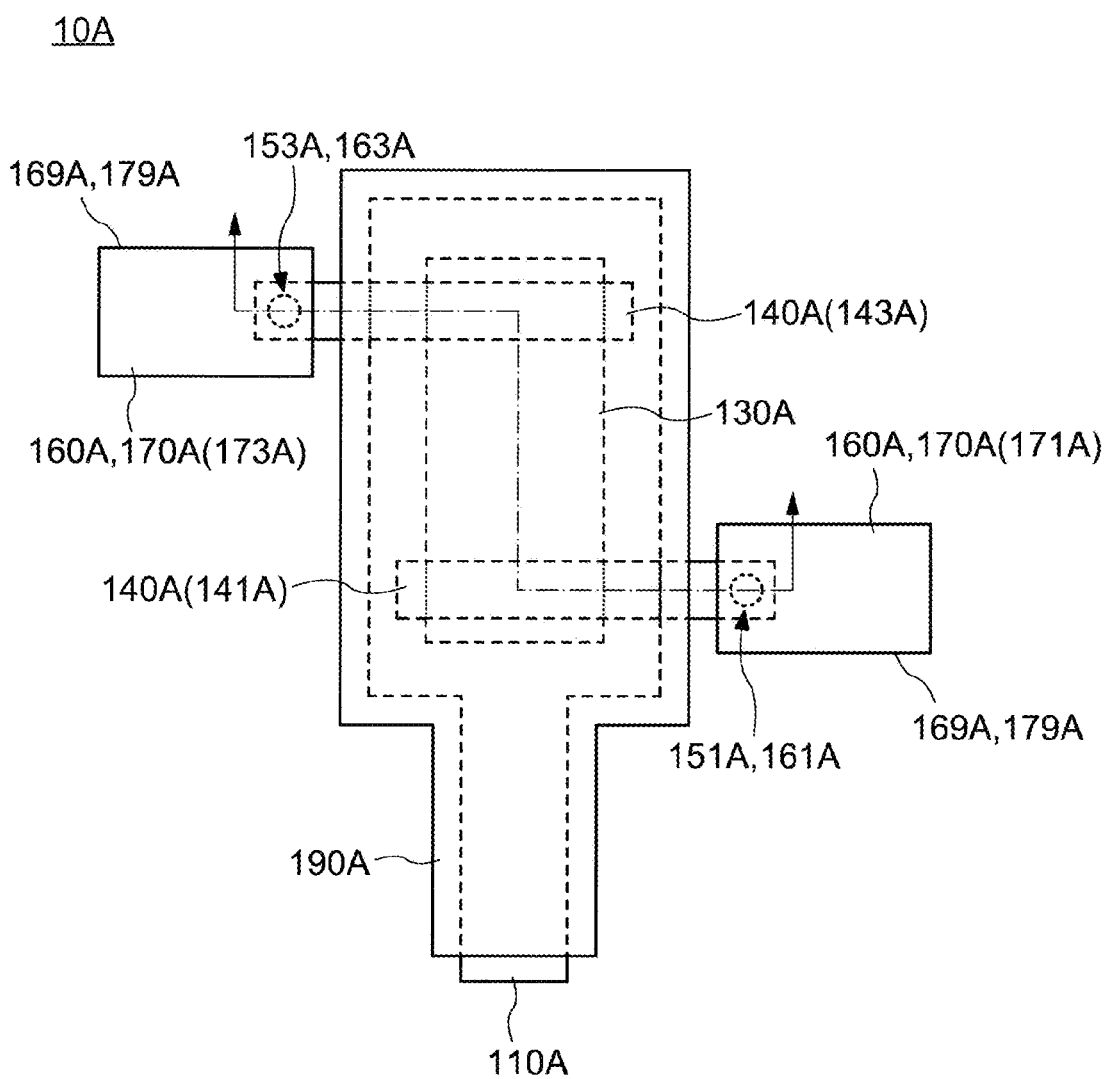
FIG. 9 is a plan view diagram showing a summary of a semiconductor device related to one embodiment of the present invention.

A semiconductor device according to one embodiment of the present invention is explained using FIG. 8 and FIG. 9.

[Structure of Semiconductor Device 10A]

A semiconductor device 10A according to one embodiment of the present invention is explained using FIG. 8 and FIG. 9. FIG. 8 is a cross-sectional diagram showing a summary of a semiconductor device according to one embodiment of the present invention. FIG. 9 is a plan view showing a summary of a semiconductor device according to one embodiment of the present invention. Although the semiconductor device 10A shown in FIG. 8 and FIG. 9 is similar to the semiconductor device 10 shown in FIG. 1 and FIG. 2, it is different from the semiconductor device 10 in that a second insulating layer 190A is arranged overlapping the first oxide semiconductor layer 130A in a plan view above the first oxide semiconductor layer 130A. In the explanation of the semiconductor device 10A herein, an explanation of features similar to those of the semiconductor device 10 are omitted, and only differences from the semiconductor device 10 will mainly be explained.

As shown in FIG. 8, the second conductive layer 190A is arranged on the opposite side of the first oxide semiconductor layer 130A with respect to the first gate electrode 110A. The second conductive layer 190A overlaps the first oxide semiconductor layer 130A in a plan view. The oxide layer 165A is arranged between the upper surface of the first insulating layer 150A and the second conductive layer 190A. In other words, the second conductive layer 190A is separated from the upper surface of the first insulating layer 150A by the oxide layer 165A. The oxide layer 165A is arranged provided in the same layer as the oxide layer 160A. The second conductive layer 190A is arranged in the same layer as the first conductive layer 170A. "Same layer" refers to the relationship between a plurality of patterned layers which are formed by patterning a certain layer.

As is shown in FIG. 9, the first oxide semiconductor layer 130A is arranged on the inner side of the second conductive layer 190A in a plan view. In particular, the first oxide semiconductor layer 130A is arranged on the inner side of the second conductive layer 190A in a region where the channel of the semiconductor device 10A is formed. In other words, the outer edge of the pattern of the first oxide semiconductor layer 130A is surrounded by the outer edge of the pattern of the second conductive layer 190A.

A voltage may be supplied to the second conductive layer 190A or it may be in a floating state without being supplied with a voltage. In the case where the second conductive layer 190A simply functions as a light shielding member, the second conductive layer 190A may be in a floating state. In the case where the second conductive layer 190A functions as a gate electrode, a voltage is supplied to the second conductive layer 190A. In the case when a voltage is supplied to the second conductive layer 190A, a voltage different from that of the first gate electrode 110A may be supplied to the second conductive layer 190A.

As described above, according to the semiconductor device 10A related to the present embodiment, it is possible to obtain the same effects as those of the semiconductor device 10 according to the first embodiment. Furthermore, since the second conductive layer 190A functions as a light shielding member, it is possible to suppress light being irradiated from above onto the first oxide semiconductor layer 130A. By suppressing the incidence of light on the first oxide semiconductor layer 130A, it is possible to suppress variations in characteristics of the semiconductor device 10A. When the second conductive layer 190A functions as a gate electrode, it is possible to stabilize the mobility of carriers on the back channel side of the first oxide semiconductor layer 130A (on the first insulating layer 150A side of the first oxide semiconductor layer 130A). In this way, it is possible to suppress variations in characteristics of the semiconductor device 10A.

Third Embodiment

A display device using a semiconductor device according to one embodiment of the present invention is explained using FIG. 10 to FIG. 14. Furthermore, in the embodiments described below, a structure in which the semiconductor device explained in the first embodiment and the second embodiment is applied to a transistor which forms a circuit of a liquid crystal display device is explained.

[Summary of Display Device 20B]

Figure 10:
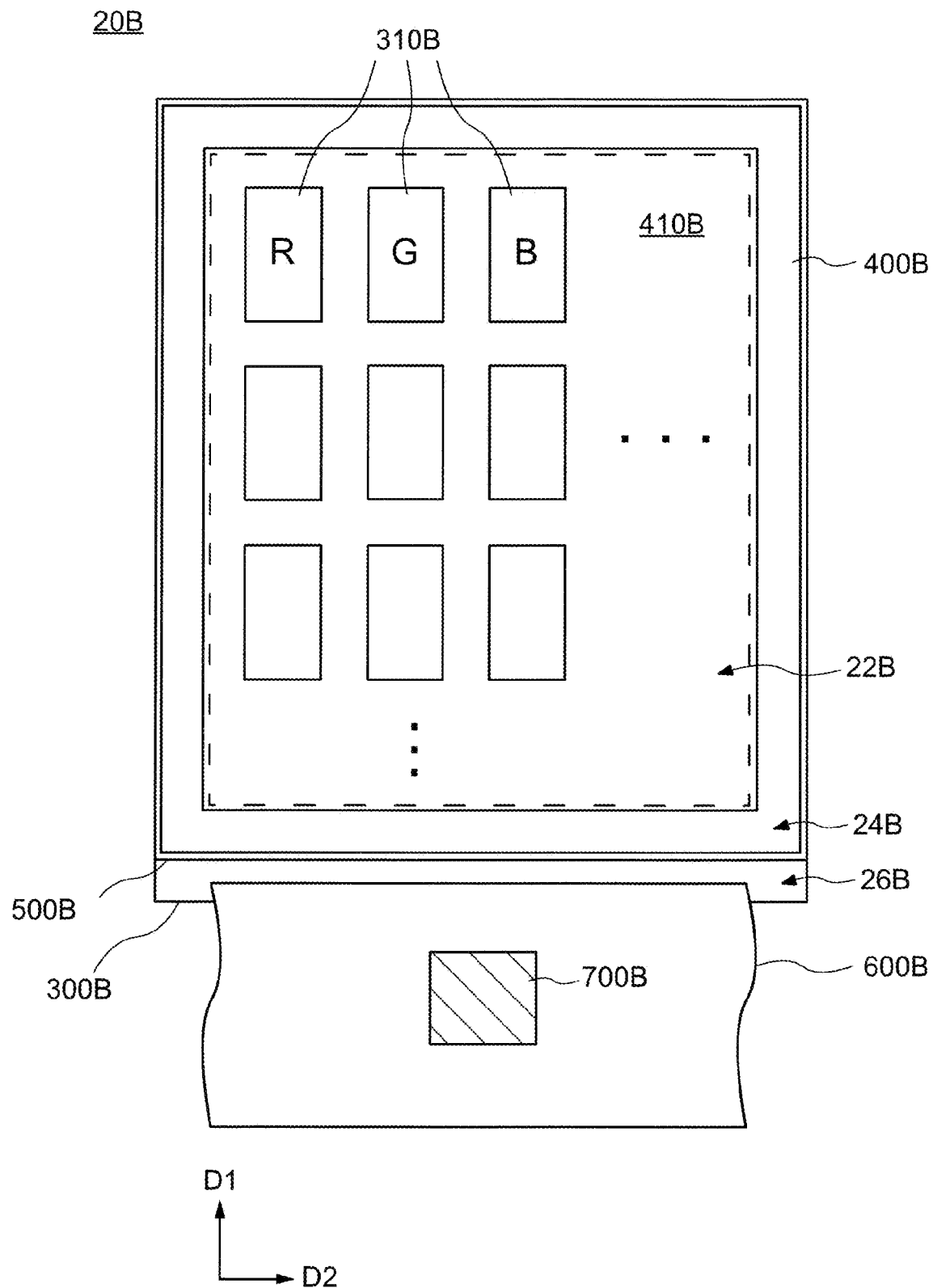
FIG. 10 is a plan view diagram showing a summary of a semiconductor device related to one embodiment of the present invention.

FIG. 10 is a plan view showing a summary of a display device according to one embodiment of the present invention. As is shown in FIG. 10, the display device 20B includes an array substrate 300B, a seal part 400B, a counter substrate 500B, a flexible printed circuit substrate 600B (FPC 600B) and an IC chip 700B. The array substrate 300B and the counter substrate 500B are bonded together by the seal part 400B. A plurality of pixel circuits 310B are arranged in a matrix in a liquid crystal region 22B which is surrounded by the seal part 400B. The liquid crystal region 22B is a region which overlaps a liquid crystal element 410B described herein in a plan view.

A seal region 24B which overlaps the seal part 400B in a plan view is a region in the periphery of the liquid crystal region 22B. The FPC 600B is arranged in a terminal region 26B. The terminal region 26B is a region where the array substrate 300B is exposed from the counter substrate 500B, and is arranged on the outer side of the seal region 24B. Furthermore, the outer side of the seal region 24B means a region in which the seal part 400B is arranged and the outer side of the region surrounded by the seal part 400B. The IC chip 700B is arranged above the FPC 600B. The IC chip 700B supplies a signal for driving each pixel circuit 310B.

[Circuit Structure of Display Device 20B]

Figure 11:
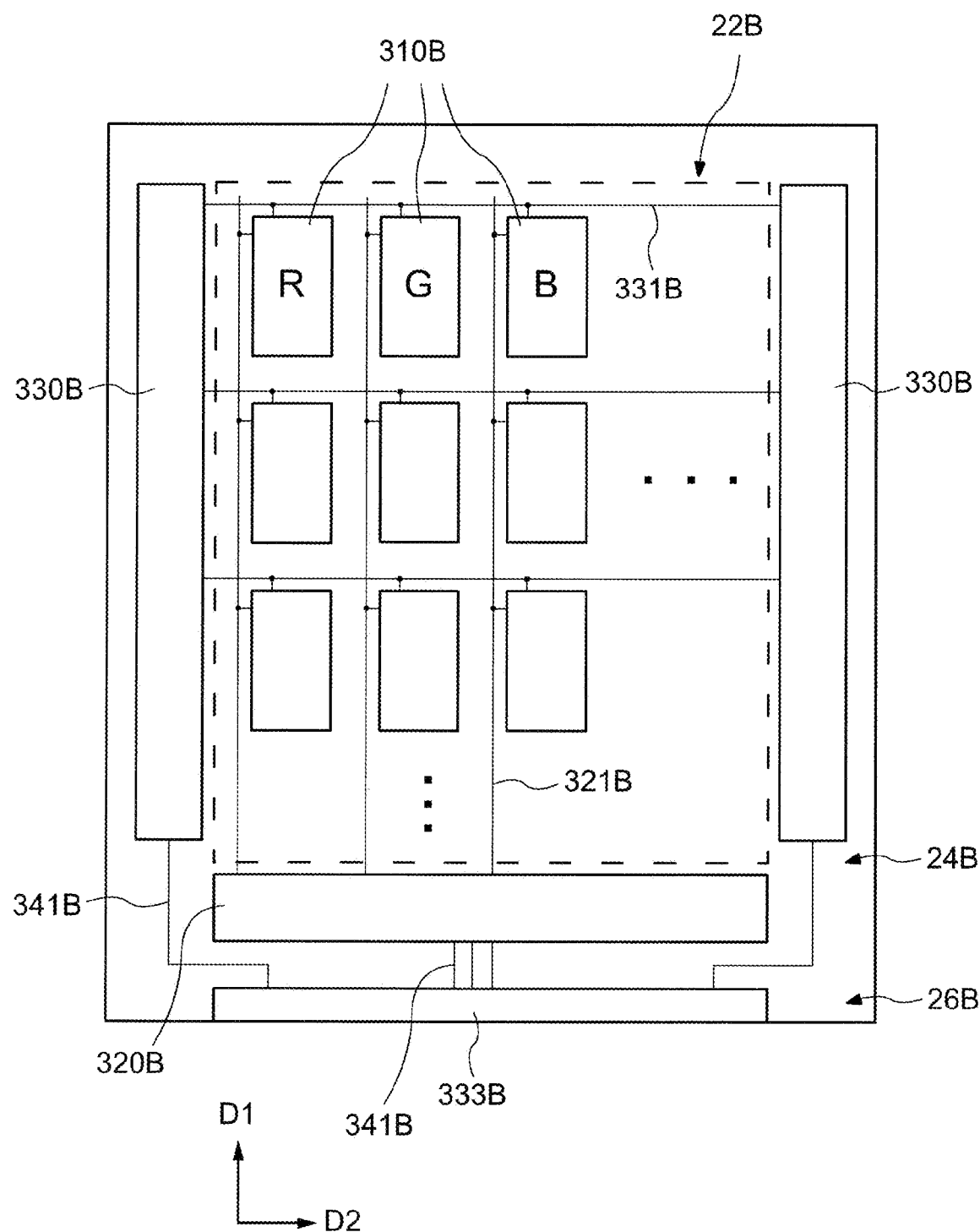
FIG. 11 is a block diagram showing a circuit structure of a display device related to one embodiment of the present invention.

FIG. 11 is a block diagram showing a circuit structure of a display device according to one embodiment of the present invention. As is shown in FIG. 11, a source driver circuit 320B is arranged at a position adjacent in the D1 direction (column direction) of the liquid crystal region 22B where the pixel circuit 310B is arranged, and a gate driver circuit 330B is arranged at a position adjacent in the D2 direction (row direction) of the liquid crystal region 22B. The source driver circuit 320B and the gate driver circuit 330B are arranged in the seal region 24B described above. However, the region where the source driver circuit 320B and the gate driver circuit 330B are arranged is not limited to the seal region 24B. The source driver circuit 320B and the gate driver circuit 330B may be arranged in a region outside a region where the pixel circuit 310B is arranged.

A source wiring 321B extends from the source driver circuit 320B in the D1 direction and is connected to a plurality of pixel circuits 310B arranged in the D1 direction. A gate wiring 331B extends from the gate driver circuit 330B in the D2 direction and is connected to a plurality of pixel circuits 310B arranged in the D2 direction.

A terminal part 333B is arranged in the terminal region 26B. The terminal part 333B and the source driver circuit 320B are connected by a connection wiring 341B. Similarly, the terminal part 333B and the gate driver circuit 330B are connected by a connection wiring 341B. By connecting the FPC 600B to the terminal part 333B, an external device which is connected to the FPC 600B and the display device 20B are connected, and a signal from the external device drives each pixel circuit 310B arranged in the display device 20B.

The semiconductor device shown in the first embodiment and the second embodiment are applied to transistors included in the pixel circuit 310B, the source driver circuit 320B and the gate driver circuit 330B.

[Pixel Circuit 310B of Display Device 20B]

Figure 12:
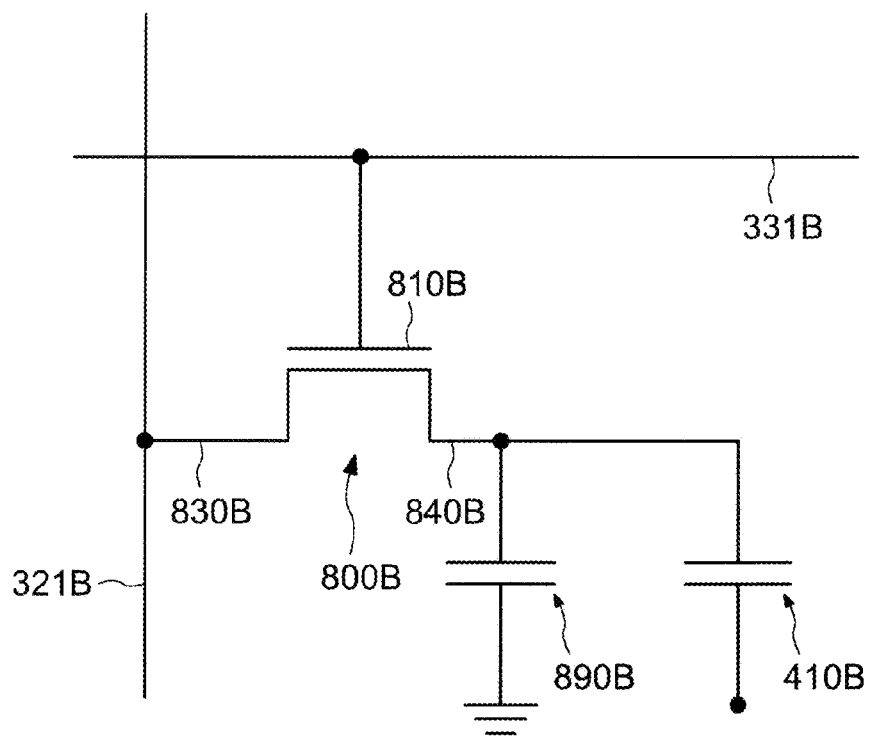
FIG. 12 is a circuit diagram showing a pixel circuit of a display device related to one embodiment of the present invention.

FIG. 12 is a circuit diagram showing a pixel circuit of a display device according to one embodiment of the present invention. As is shown in FIG. 12, the pixel circuit 310B includes elements such as a transistor 800B, a storage capacitor 890B and a liquid crystal element 410B. The transistor 800B includes a first gate electrode 810B, a first source electrode 830B and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The semiconductor device shown in the first embodiment and the second embodiment is applied to the transistor shown in FIG. 12. Furthermore, although 830B is referred to as a source electrode and 840B is referred to as a drain electrode in the present embodiment for the convenience of explanation, the function as the source and the function as the drain of each electrode may be interchanged.

[Cross-Sectional Structure of Display Device 20B]

Figure 13:
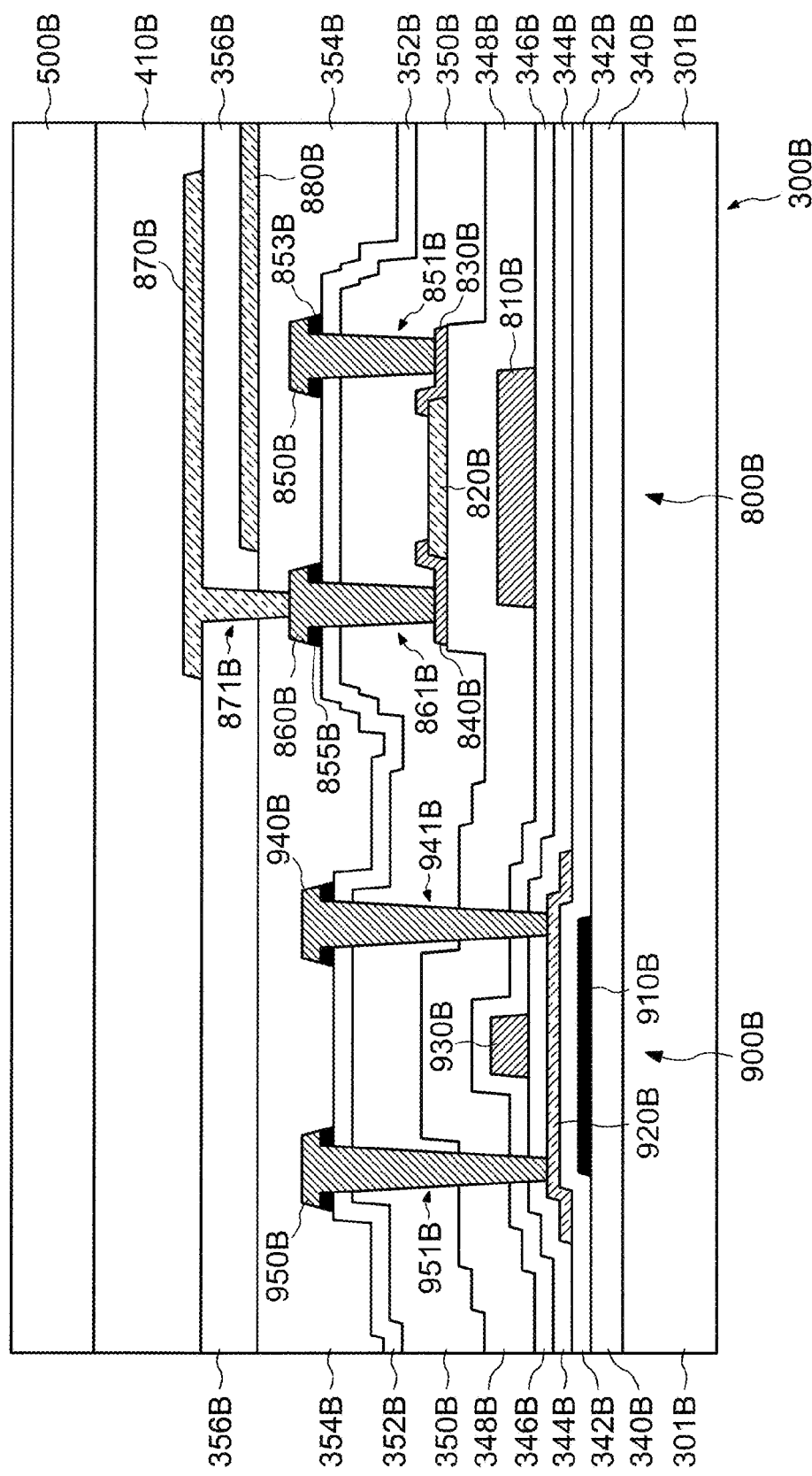
FIG. 13 is a cross-sectional diagram showing a display device related to one embodiment of the present invention.

FIG. 13 is a cross-sectional diagram of a display device according to one embodiment of the present invention. As is shown in FIG. 13, the display device 20B is a display device in which transistors 800B and 900B which have different structures are arranged above the same substrate. The structure of the transistor 800B is different from the structure of the transistor 900B. Specifically, the transistor 800B is a bottom-gate type transistor in which the first oxide semiconductor layer 820B is used as a channel. The transistor 900B is a top-gate type transistor in which the semiconductor layer 920B is used as a channel. For example, the transistor 800B is used for the pixel circuit 310B, and the transistor 900B is used for the source driver circuit 320B and the gate driver circuit 330B. Furthermore, the transistor 900B may be used for the pixel circuit 310B.

The transistor 800B is a transistor formed above the substrate 301B, and the insulating layers 340B, 342B, 344B and 346B are used as base layers. A first gate electrode 810B is arranged above the insulating layer 346B. A first oxide semiconductor layer 820B is arranged above the first gate electrode 810B. The first gate electrode 810B is opposed to the first oxide semiconductor layer 820B. An insulating layer 348B which functions as a gate insulating layer is arranged between the first gate electrode 810B and the first oxide semiconductor layer 820B. A first source electrode 830B is arranged at one end part of a pattern of the first oxide semiconductor layer 820B, and a first drain electrode 840B is arranged at the other end part of a pattern of the first oxide semiconductor layer 820B. The first source electrode 830B and the first drain electrode 840B are connected to the first oxide semiconductor layer 820B on the top surface and side surface of the first oxide semiconductor layer 820B respectively.

The first insulating layers 350B and 352B are arranged above the first oxide semiconductor layer 820B, the first source electrode 833B and the first drain electrode 840B. Openings 851B and 861B are arranged in the first insulating layers 350B and 352B. A first source wiring 850B is arranged above the first insulating layer 352B and inside the opening 851B. A first drain wiring 860B is arranged above the first insulating layer 352B and inside the opening 861B. An oxide layer 853B is arranged between the top surface of the first insulating layers 352B and the first source wiring 850B. An oxide layer 855B is arranged between the top surface of the first insulating layers 352B and the first drain wiring 860B.

A second insulating layer 354B is arranged above the first source wiring 850B and the first drain wiring 860B. A common electrode 880B which is arranged in common for a plurality of pixels is arranged above the second insulating layer 354B. A second insulating layer 356B is arranged above the common electrode 880B. A third opening 871B is arranged in the second insulating layers 354B and 356B. A pixel electrode 870B is arranged above the second insulating layer 356B and inside the third opening 871B. The pixel electrode 870B is connected to the first drain wiring 860B.

Figure 14:
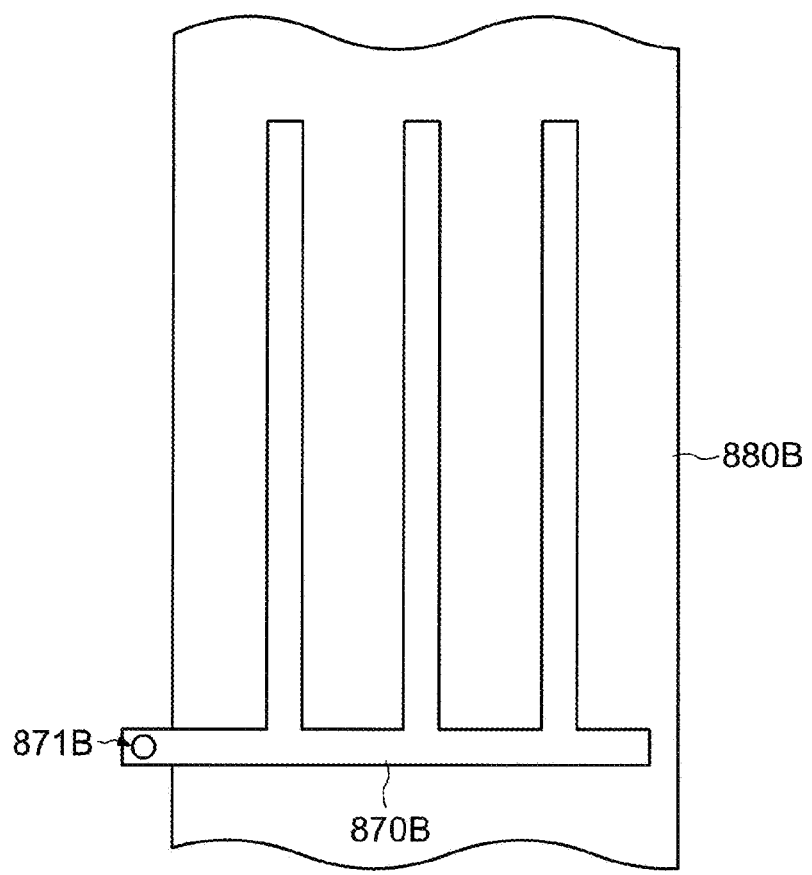
FIG. 14 is a plan view diagram showing pixel electrode and a common electrode of a display device related to one embodiment of the present invention.
Figure 14:
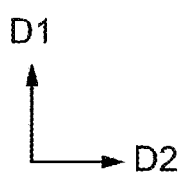

FIG. 14 is a plan view of a pixel electrode and a common electrode of a display device according to one embodiment of the present invention. As is shown in FIG. 14, the common electrode 880B has an overlapping region which overlaps with the pixel electrode 870B in a plan view, and a non-overlapping region which does not overlap with the pixel electrode 870B. When a voltage is supplied between the pixel electrode 870B and the common electrode 880B, a horizontal electric field is formed from the pixel electrode 870B in the overlapping region toward the common electrode 880B in the non-overlapping region. The gradation of the pixel is determined by the operation of liquid crystal molecules which are included in the liquid crystal element 410B by the horizontal electric field.

In the structure described above, it is possible to apply the semiconductor devices 10 or 10A in FIG. 1 or FIG. 8 as a transistor 800B. In this case, when FIG. 1 and FIG. 8 are compared with FIG. 13, each member in each drawing corresponds as follows. The first gate electrodes 110 and 110A correspond to the first gate electrode 810B. The first gate insulating layers 120 and 120A correspond to the insulating layer 348B. The first oxide semiconductor layers 130 and 130A correspond to the first oxide semiconductor layer 820B. The first source electrodes 141 and 141A correspond to the first source electrode 830B. The first drain electrodes 143 and 143A correspond to the first drain electrode 840B. The first insulating layers 150 and 150A correspond to the first insulating layers 350B and 352B. The first openings 151 and 151A correspond to the opening 851B. The first openings 153 and 153A correspond to the opening 861B. The oxide layer 160 corresponds to the oxide layers 853B and 855B. The first source wirings 171 and 171A correspond to the first source wiring 850B. The first drain wirings 173 and 173A correspond to the first drain wiring 860B.

The transistor 900B is a transistor which is formed in the substrate 301B, and the insulating layer 340B is used as a base layer. A light shielding layer 910B is arranged above the insulating layer 340B. An insulating layer 342B is provided over the light shielding layer 910B. A semiconductor layer 920B is arranged above the insulating layer 342B. A second gate electrode 930B is arranged above the semiconductor layer 920B. An insulating layer 344B which functions as a gate insulating layer is arranged between the semiconductor layer 920B and the second gate electrode 930B. Insulating layers 346B, 348B, 350B and 352B are arranged above the second gate electrode 930B. Openings 941B and 951B are arranged in these insulating layers. A second source wiring 940B is arranged above the insulating layer 352B and inside the opening 941B. A second drain wiring 950B is arranged above the insulating layer 352B and inside the opening 951B. An insulating layer 354B is arranged above the second source wiring 940B and the second drain wiring 950B. In other words, the second gate electrode 930B is arranged under a layer (insulating layer 348B) which is the same layer as the gate insulating layer of the transistor 800B.

Fourth Embodiment

Figure 15:
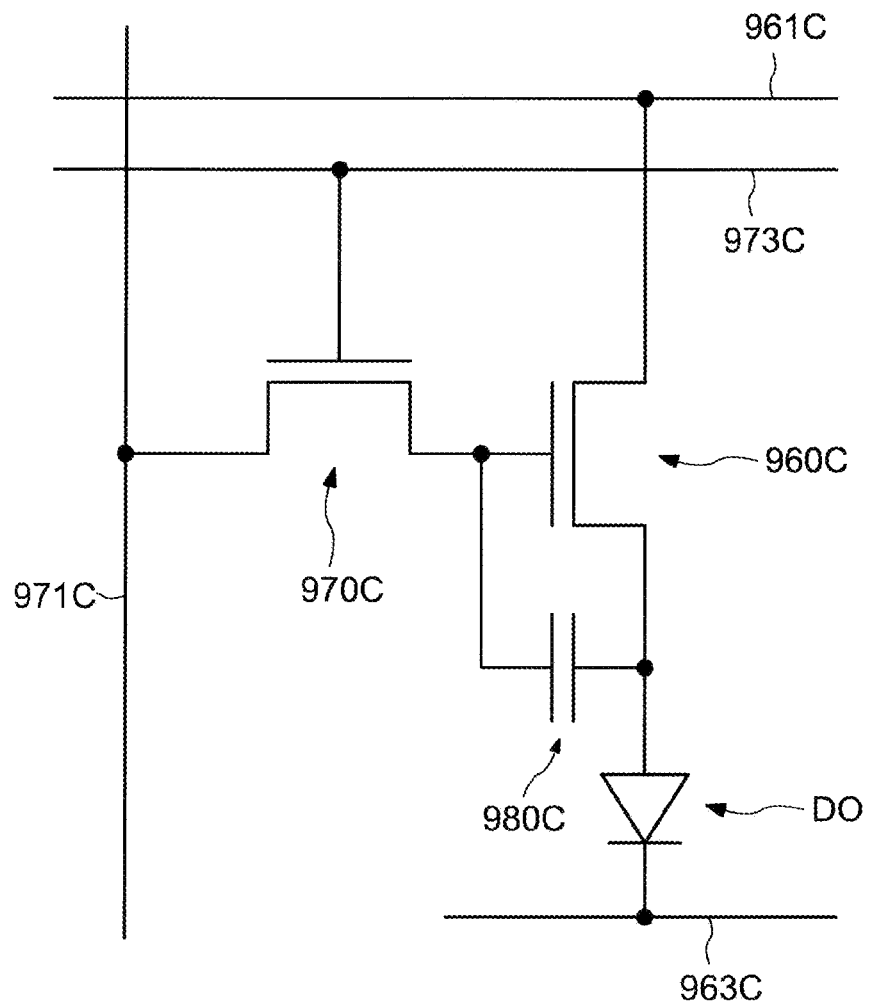
FIG. 15 is a circuit diagram showing a pixel circuit of a display device related to one embodiment of the present invention.
Figure 16:
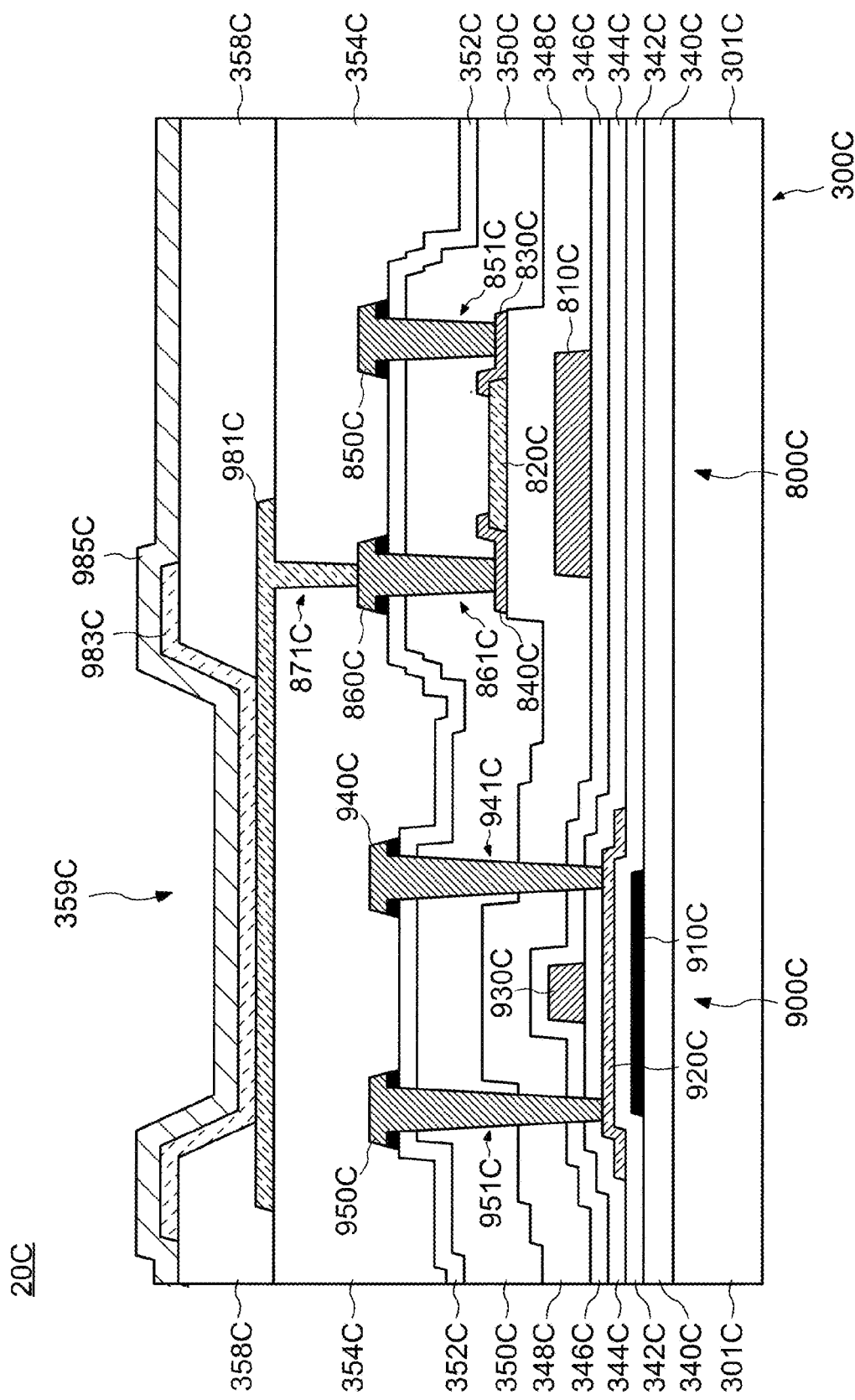
FIG. 16 is a cross-sectional diagram showing a display device related to one embodiment of the present invention.

A display device using a semiconductor device according to one embodiment of the present invention are explained using FIG. 15 and FIG. 16. Furthermore, in the embodiment described below, a structure is explained in which the semiconductor device explained in the first embodiment and the second embodiment is applied to a circuit of an organic EL display device. Furthermore, since a summary and circuit structure of the display device 20C are the same as those shown in FIG. 10 and FIG. 11, an explanation is omitted.

[Pixel Circuit 310C of Display Device 20C]

FIG. 15 is a circuit diagram showing a pixel circuit of a display device according to one embodiment of the present invention. As is shown in FIG. 15, the pixel circuit 310C includes elements such as a drive transistor 960C, a selection transistor 970C, a storage capacitor 980C and a light emitting element DO. The source electrode of the selection transistor 970C is connected to the signal line 971C, and the gate electrode of the selection transistor 970C is connected to the gate line 973C. The source electrode of the drive transistor 960C is connected to an anode power supply line 961C, and the drain electrode of the drive transistor 960C is connected to one end of the light emitting element DO. The other end of the light emitting element DO is connected to a cathode electrode 963C. The gate electrode of the driving transistor 960C is connected to the drain electrode of the selection transistor 970C. The storage capacitor 980C is connected to the gate electrode and the drain electrode of the drive transistor 960C. A gradation signal for determining the light emitting intensity of the light emitting element DO is supplied to the signal line 971C. A signal for selecting a pixel row in which the gradation signal described above is written is supplied to the gate line 973C.

[Cross-Sectional Structure of Display Device 20C]

FIG. 16 is a cross-sectional diagram of a display device according to one embodiment of the present invention. Although the structure of the display device 20C shown in FIG. 16 is similar to the display device 20B shown in FIG. 13, they are different in that the structure is further above the insulating layer 354C of the display device 20C but here the structure is above the insulating layer 354B of the display device 20B. Herein, in the structure of the display device 20C shown in FIG. 16, an explanation of the same structure as the display device 20B shown in FIG. 13 is omitted, and differences from the display device 20B are explained.

As is shown in FIG. 16, the display device 20C includes a pixel electrode 981C, a light emitting layer 983C and a common electrode 985C above the insulating layer 354C. The pixel electrode 981C is arranged above the insulating layer 354C and inside the opening 871C. An insulating layer 358C is arranged above the pixel electrode 981C. An opening 359C is arranged in the insulating layer 358C. The opening 359C corresponds to a light emitting region. That is, the insulating layer 358C defines a pixel. A light emitting layer 983C and a common electrode 985C are arranged above the pixel electrode 981C exposed through the opening 359C. The pixel electrode 981C and the light emitting layer 983C are separately arranged for each pixel. On the other hand, the common electrode 985C is arranged in common for a plurality of pixels. Different materials are used for the light emitting layer 983C depending on the display color of the pixel.

In the third embodiment and fourth embodiment, although a structure was exemplified in which the semiconductor device explained in the first embodiment and the second embodiment was applied to a liquid crystal display device and an organic EL display device, displays other than these display devices (for example, a self-luminous display device or an electronic paper display device other than an organic EL display device) may also be applied with the semiconductor device. In addition, the semiconductor device described above can be applied without any particular limitation from a small sized display device to a large sized display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
    an oxide semiconductor layer;
    a gate electrode opposing the oxide semiconductor layer;
    a gate insulating layer between the oxide semiconductor layer and the gate electrode;
    a first insulating layer covering the oxide semiconductor layer;
    an oxide layer;
    a first conductive layer above the first insulating layer; and
    a first electrode arranged above the oxide semiconductor layer and contacting an upper surface of the oxide semiconductor layer,
    wherein
    the first conductive layer has a lower surface facing an upper surface of the first insulating layer,
    the oxide layer is arranged between the upper surface of the first insulating layer and the first conductive layer, and directly contacting to the upper surface of the first insulating layer and the lower surface of the first conductive layer,
    the first insulating layer have a first opening,
    the oxide layer has a second opening overlapping the first opening in a plan view,
    the first conductive layer is arranged in the first opening and the second opening,
    the first conductive layer is electrically connected to the oxide semiconductor layer, and
    the first conductive layer directly contacts the first electrode at a bottom part of the first opening.

2. The semiconductor device according to claim 1, wherein the first insulating layer is exposed from the oxide layer in a region not overlapping the first conductive layer in a plan view.

3. The semiconductor device according to claim 2, further comprising:
    a second conductive layer on an opposite side to the first gate electrode with respect to the oxide semiconductor layer, the second conductive layer overlapping the oxide semiconductor layer in a plan view;
    wherein
    the first insulating layer is arranged between the oxide semiconductor layer and the second conductive layer, and
    the oxide layer is arranged between the upper surface of the first insulating layer and the second conductive layer.

4. The semiconductor device according to claim 1, wherein the gate electrode is arranged below the oxide semiconductor layer.

5. The semiconductor device according to claim 1, wherein the gate electrode is arranged above the oxide semiconductor layer.

6. The semiconductor device according to claim 1, wherein the first conductive layer contacts the oxide layer at a side wall of the second opening.

7. The semiconductor device according to claim 1, wherein a pattern of the oxide layer is substantially the same pattern as a pattern of the first conductive layer in a plan view.

8. The semiconductor device according to claim 1, wherein the oxide layer contains argon.

9. The semiconductor device according to claim 1, wherein the first insulating layer is an oxide insulating layer,
the oxide layer is an oxide insulating layer with the same composition as the first insulating layer, and
a composition ratio of oxygen in the oxide layer is larger than a composition ratio of oxygen in the first insulating layer.

* * * * *